United States Patent
Adiga et al.

(10) Patent No.: US 11,121,304 B2
(45) Date of Patent: Sep. 14, 2021

(54) JUNCTION FABRICATION METHOD FOR FORMING QUBITS

(71) Applicant: INTERNATIONAL BUSINESS MACHINES CORPORATION, Armonk, NY (US)

(72) Inventors: Vivekananda P. Adiga, Ossining, NY (US); Benjamin B. Wymore, Cortlandt Manor, NY (US); Keith Fogel, Hopewell Junction, NY (US); Martin O. Sandberg, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/684,423

(22) Filed: Nov. 14, 2019

(65) Prior Publication Data

US 2021/0151660 A1 May 20, 2021

(51) Int. Cl.
*H01L 39/24* (2006.01)
*G06N 10/00* (2019.01)
(Continued)

(52) U.S. Cl.
CPC ......... *H01L 39/2493* (2013.01); *G06N 10/00* (2019.01); *H01L 27/18* (2013.01); *H01L 39/223* (2013.01)

(58) Field of Classification Search
CPC ... H01L 39/2493; H01L 27/18; H01L 39/223; G06N 10/00
See application file for complete search history.

(56) References Cited

U.S. PATENT DOCUMENTS

| 9,559,284 B2 | 1/2017 | Chang et al. |
| 2018/0358537 A1 | 12/2018 | Brink et al. |

(Continued)

FOREIGN PATENT DOCUMENTS

| WO | 2017217961 A1 | 12/2017 |
| WO | 2018159832 A1 | 9/2018 |

(Continued)

OTHER PUBLICATIONS

Characterization and Reduction of Capacitive Loss Induced by Sub-Micron Josephson Junction Fabrication in Superconducting Quibits: Dunsworth et al.,; Entire article: (Year: 2017).*

(Continued)

*Primary Examiner* — Zandra V Smith
*Assistant Examiner* — Andre C Stevenson
(74) *Attorney, Agent, or Firm* — Henry J. Daley; Venable LLP

(57) ABSTRACT

A method of making a Josephson junction for a superconducting qubit includes providing a substructure having a surface with first and second trenches perpendicular to each other defined therein. The method further includes evaporating a first superconducting material to deposit the first superconducting material and evaporating a second superconducting material to deposit the second superconducting material in the first trench to provide a first lead, and forming an oxidized layer on the first and second superconducting materials. The method includes evaporating a third superconducting material at an angle substantially perpendicular to the surface of the substructure to deposit the third superconducting material in the second trench without rotating the substructure to form a second lead. A vertical Josephson junction is formed at the intersection of the first and second trenches electrically connected through the first lead and through the second lead.

25 Claims, 12 Drawing Sheets

(51) Int. Cl.
H01L 27/18 (2006.01)
H01L 39/22 (2006.01)

(56) References Cited

U.S. PATENT DOCUMENTS

2019/0042967 A1* 2/2019 Yoscovits ......... H01L 29/66977
2019/0273198 A1* 9/2019 Brink .................... G06N 10/00

FOREIGN PATENT DOCUMENTS

| WO | 2019/032114 A1 | 2/2019 |
| WO | 2019/032115 A1 | 2/2019 |
| WO | 2019/074557 A1 | 4/2019 |
| WO | 2019091592 A1 | 5/2019 |
| WO | 2019180267 A1 | 9/2019 |

OTHER PUBLICATIONS

G. J. Dolan, "Offset masks for lift off photoprocessing", Applied Physics Letters 31, 337-339 (1977) <https://doi.org/10.1063/1.89690>.
Lecocq et al., "Junction fabrication by shadow evaporation without a suspended bridge", Nanotechnology 22 (2011) 315302.
PCT/EP/2020081661 International Search Report completed Feb. 18, 2021.
PCT/EP/2020081661 Written Opinion completed Feb. 18, 2021.
G.J. Dolan et al., "Very Small (> 20nm) Lithographic Wires, Dots, Rings, and Tunnel Junctions", Physica B 152 (1988) 7-13.

* cited by examiner

JUNCTION FABRICATION METHOD FOR FORMING QUBITS

BACKGROUND

The currently claimed embodiments of the present invention relate to superconducting qubits, and more specifically, to methods of making superconducting qubits and qubits made using the methods.

Quantum computation is based on the reliable control of quantum bits (referred to herein throughout as qubits). The fundamental operations required to realize quantum algorithms are a set of single-qubit operations and two-qubit operations which establish correlations between two separate quantum bits. The realization of high fidelity two-qubit operations may be desirable both for reaching the error threshold for quantum computation and for reaching reliable quantum simulations.

The superconducting quantum processor (having one or more superconducting qubits) includes superconducting metals (e.g., Al, Nb, etc.) on an insulating substrate (e.g., Si or high resistivity Si, $Al_2O_3$, etc.). The superconducting quantum processor is typically a planar two-dimensional lattice structure of individual qubits linked by a coupler in various lattice symmetry (for example, square, hexagonal, etc.), and a readout structure located on a flip-chip. The couplers can be made of a capacitor, a resonator, a coil or any microwave component that provides a coupling between qubits.

Conventional methods of fabricating superconducting qubits are based on the standard Josephson junction fabrication using the Dolan or Manhattan methods to form bridges. The above methods require many steps including rotating a substrate supporting the qubit during a deposition of the superconducting material.

SUMMARY

An aspect of the present invention is to provide a method of making a Josephson junction for a superconducting qubit. The method includes providing a substructure having a surface with first and second trenches defined therein, the first trench being substantially perpendicular to and intersecting the second trench, the substructure having a bridge structure extending over the first trench adjacent the intersection of the first and second trenches. The method further includes evaporating a first superconducting material at a glancing angle along a first direction to deposit the first superconducting material in the first trench so as to extend under the bridge structure from the first direction. The method also includes evaporating a second superconducting material substantially at the glancing angle substantially opposite to the first direction to deposit the second superconducting material in the first trench so as to extend under the bridge structure from the glancing angle substantially opposite to the first direction and to provide a first superconducting lead. The method further includes oxidizing the first and second superconducting materials to form an oxidized layer on the first and second superconducting materials at least within the first trench; and evaporating a third superconducting material at an angle substantially perpendicular to the surface of the substructure to deposit the third superconducting material in the second trench within the substructure without rotating the substructure to form a second superconducting lead. The method also includes lifting off regions of the deposited first, second and third superconducting materials and the oxide layer to leave a vertical Josephson junction at the intersection of the first and second trenches electrically connected at a first end thereof through the first superconducting lead and at a second end thereof through the second superconducting lead.

Another aspect of the present invention is to provide a superconducting qubit. The superconducting qubit is made by: 1) providing a substructure having a surface with first and second trenches defined therein, the first trench being substantially perpendicular to and intersecting the second trench, the substructure having a bridge structure extending over the first trench; 2) evaporating a first superconducting material at a glancing angle along a first direction to deposit the first superconducting material in the first trench so as to extend under the bridge structure from the first direction; 3) evaporating a second superconducting material substantially at the glancing angle substantially opposite to the first direction to deposit the second superconducting material in the first trench so as to extend under the bridge structure from the glancing angle substantially opposite to the first direction and to provide a first superconducting lead; 4) oxidizing the first and second superconducting materials to form an oxidized layer on the first and second superconducting materials at least within the first trench; 5) evaporating a third superconducting material at an angle substantially perpendicular to the surface of the substructure to deposit the third superconducting material in the second trench within the substructure without rotating the substructure to form a second superconducting lead; and 6) lifting off regions of the deposited first, second and third superconducting materials and the oxide layer to leave a vertical Josephson Junction at the intersection of the first and second trenches electrically connected at a first end thereof through the first superconducting lead and at a second end thereof through the second superconducting lead.

BRIEF DESCRIPTION OF THE DRAWINGS

The present disclosure, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention.

DETAILED DESCRIPTION

Figure 1A:
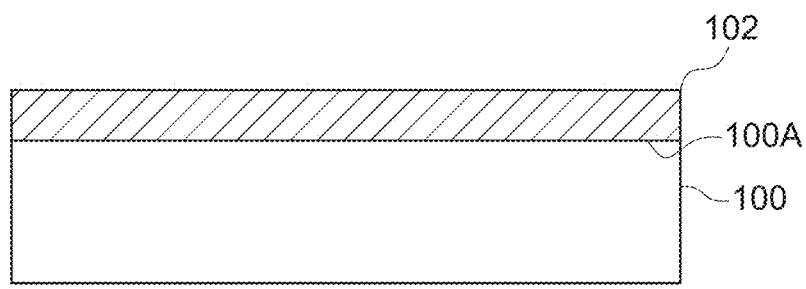
FIG. 1A is a schematic lateral view of a substrate on which is deposited a superconducting material, according to an embodiment of the present invention.

In an embodiment, a method of making a Josephson junction for a superconducting qubit is provided herein. In an embodiment, the method includes providing a substructure including a substrate and superconducting material. FIG. 1A is a schematic lateral view of a substrate on which is deposited a superconducting material, according to an embodiment of the present invention. In an embodiment, providing the substructure includes providing a substrate 100 and depositing a superconducting material 102 on a surface (e.g., top surface) 100A of the substrate 100.

In an embodiment, the substrate 100 can be any non-conductor material including, but not limited to, Silicon (Si), Germanium (Ge), and Sapphire. In an embodiment, the superconducting material 102 can be any superconducting material including, but not limited to, Niobium (Nb), Aluminum (Al), etc.

Figure 1B:
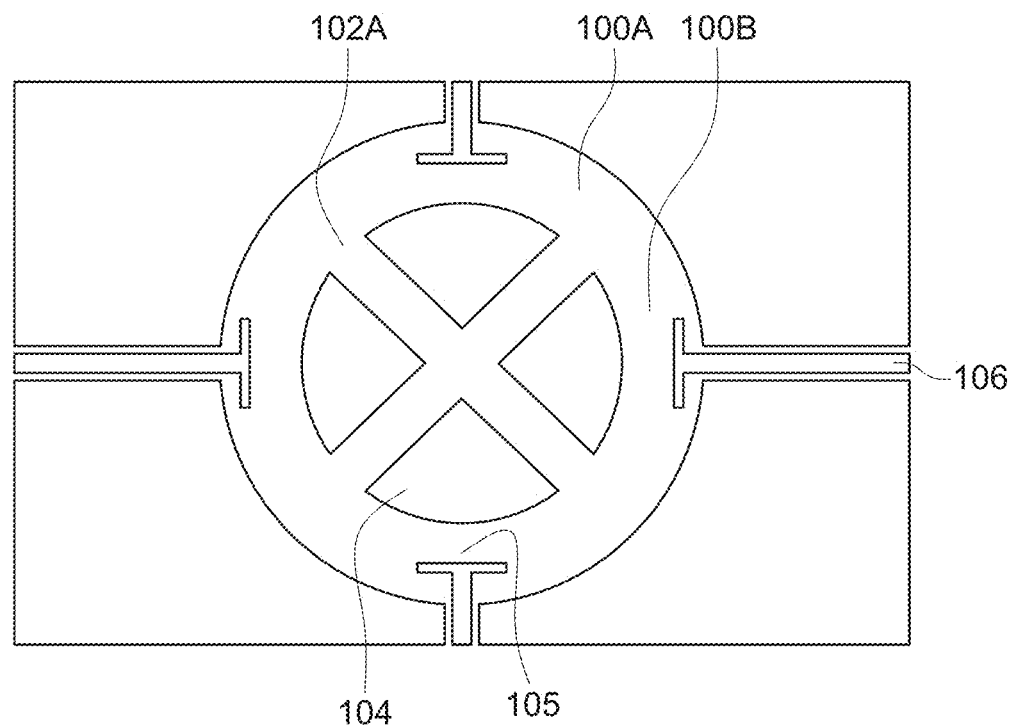
FIG. 1B is a schematic top view of the substrate with the superconducting material deposited thereon, according to an embodiment of the present invention.

FIG. 1B is a schematic top view of the substrate with the superconducting material deposited thereon, according to an embodiment of the present invention. In an embodiment, providing the substructure includes removing a portion 102A of the superconducting material 102 from the surface 100A of the substrate 100 to uncover a portion 100B of the surface 100A of the substrate. FIG. 1B shows the portion 102A of the superconducting material 102 already removed. In an embodiment, removing the portion 102A of the superconducting material 102 from the surface 100A of the substrate 100 to uncover the portion 100B of the surface 100A of the substrate 100 includes forming a plurality of sectors 104 (e.g., four) of the superconducting material 102 and associated buses 106. The plurality of sectors (e.g., four) 104 are separated apart by the uncovered portion 100B of the surface 100A of the substrate 100. The plurality of sectors 104 define coupling pads for coupling to a Josephson junction as will be described in detail in the following paragraphs. The buses or resonators 106 are configured to couple to the plurality of sectors 104 for transmitting microwave energy to and from the Josephson junction. The gap 105 formed between each of the plurality of sectors 104 and the corresponding bus or resonator 106 define a coupling capacitor. Although the plurality of sectors 104 are shown herein as having a "sector" shape, as it must be appreciated, the sectors or pads 104 are not limited to the "sector" shape but can be any other shape such as any polygonal (triangular, square, rectangular, pentagonal, hexagonal, etc.) shape, or rounded (semi-circular, disc, etc.) shape.

Figure 2A:
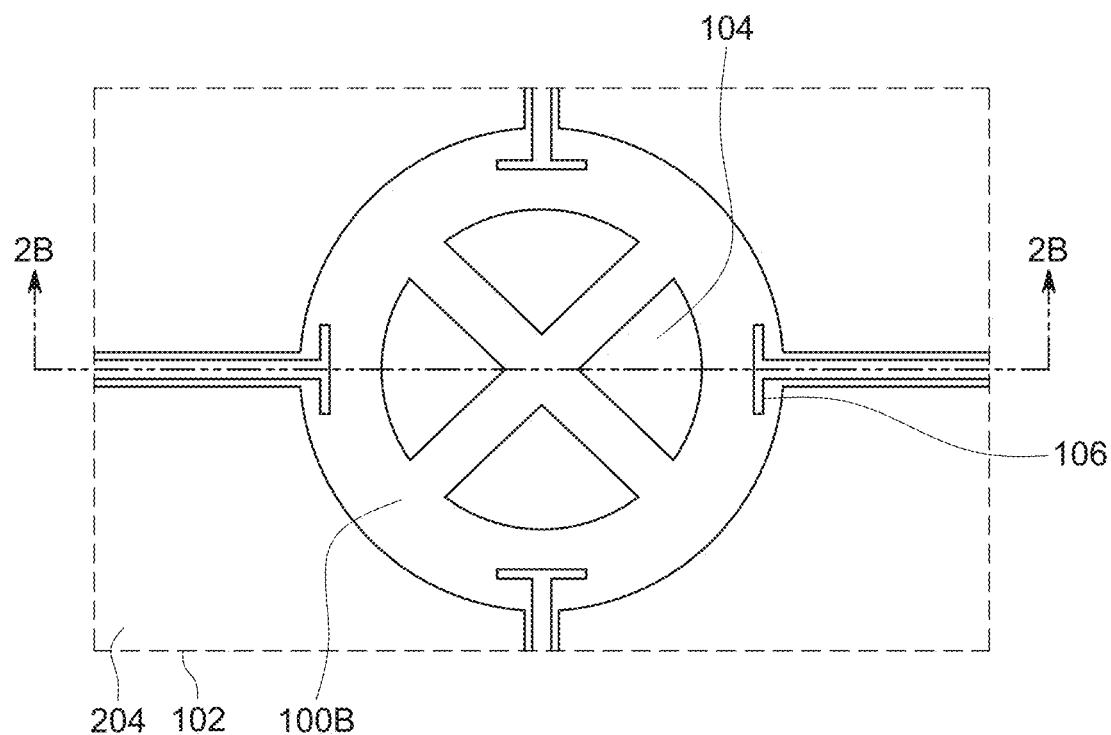
FIG. 2A is a schematic top view of the substrate with the superconducting material and sacrificial resist layers deposited thereon, according to an embodiment of the present invention.
Figure 2B:
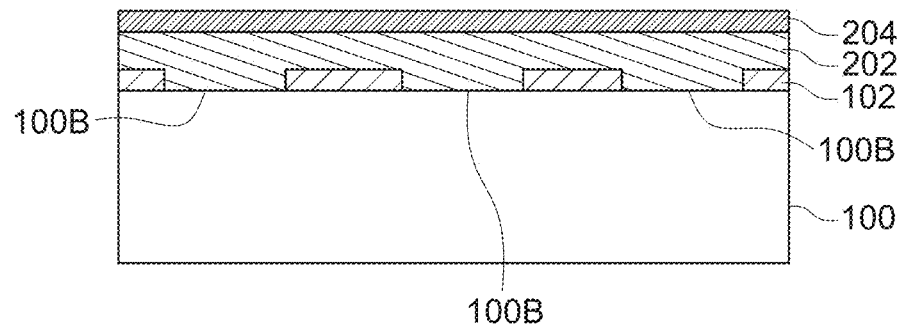
FIG. 2B is a schematic cross-section view of the substrate, along dotted line 2B-2B shown in FIG. 2A, with the superconducting material and sacrificial resist layer deposited thereon, according to an embodiment of the present invention.

FIG. 2A is a schematic top view of the substrate with the superconducting material and sacrificial resist layers deposited thereon, according to an embodiment of the present invention. FIG. 2B is a schematic cross-section view of the substrate, along dotted line 2B-2B shown in FIG. 2A, with the superconducting material and sacrificial resist layer deposited thereon, according to an embodiment of the present invention. In an embodiment, subsequent to removing the portion 102A of the superconducting material 102 from the surface 100A of the substrate 100 to uncover the portion 100B of the surface 100A of the substrate 100, providing the substructure includes depositing a first resist layer 202 on the superconducting material 102 and on the uncovered portion 100B of the surface 100A of the substrate 100. In an embodiment, providing the substructure includes depositing a second resist layer 204 on the first resist layer 202 to form superposed first and second resist layers.

In an embodiment, the first resist layer 202 can be for example a layer of monomethyl methacrylate (MMA) and the second resist layer 204 can be for example a layer of polymethyl methacrylate (PMMA). In an embodiment, this set of sacrificial resist layers 202 and 204 are selected so that the first resist layer 202 (e.g., MMA) is etched faster than the second resist layer 204 (e.g., PMMA), as will be described in further detail in the following paragraphs.

Figure 3A:
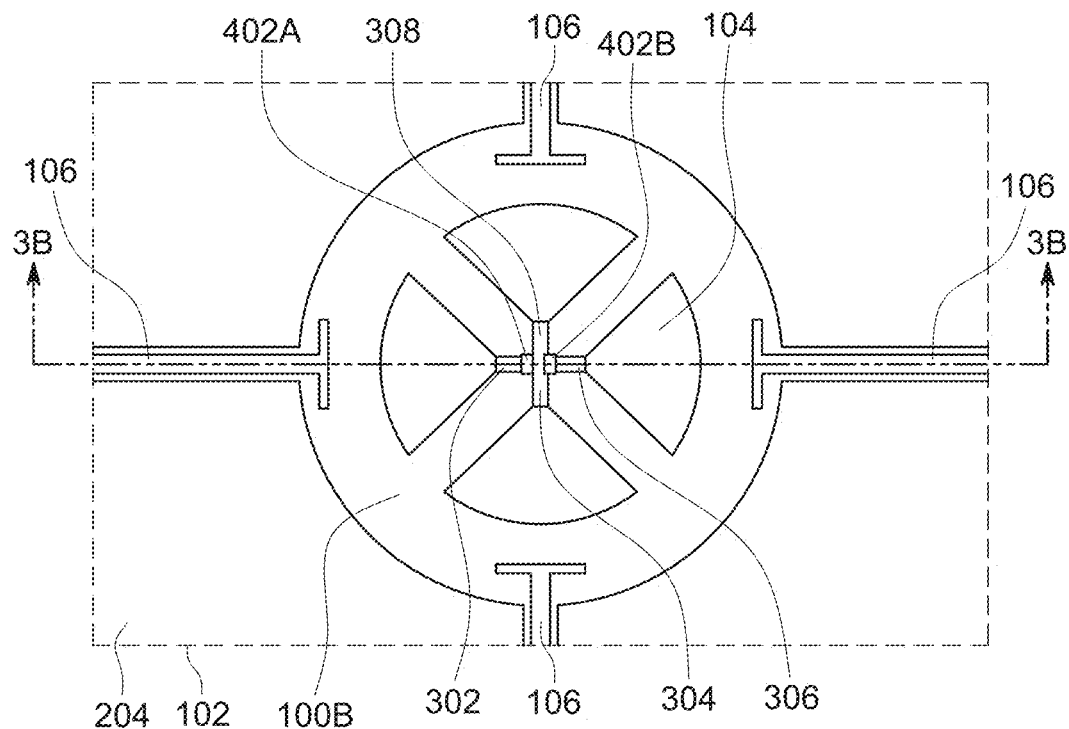
FIG. 3A is a schematic top view of the substrate with the superconducting material and sacrificial resist layers deposited thereon and trenches formed in the resist layers, according to an embodiment of the present invention.
Figure 3B:
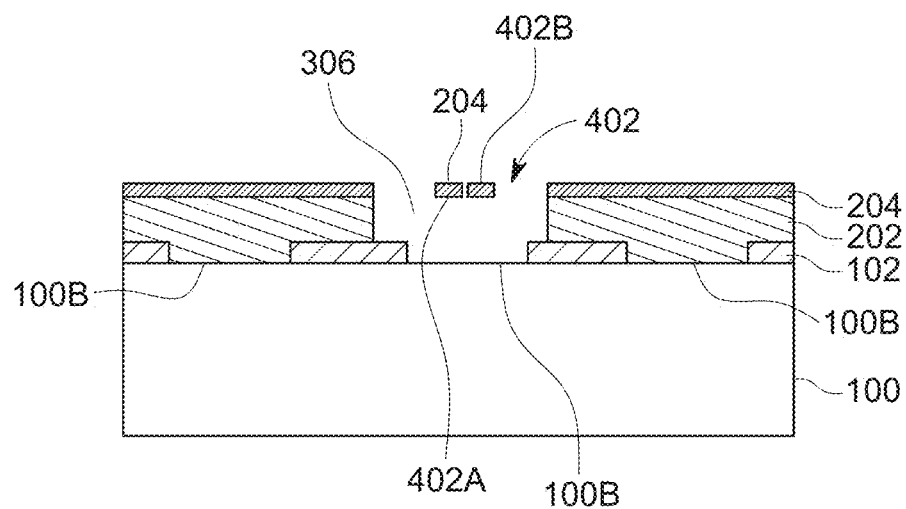
FIG. 3B is a schematic cross-section view of the substrate, along dotted line 3B-3B shown in FIG. 3A, with the superconducting material and sacrificial resist layer deposited thereon and trenches formed in the resist layers, according to an embodiment of the present invention.
Figure 4A:
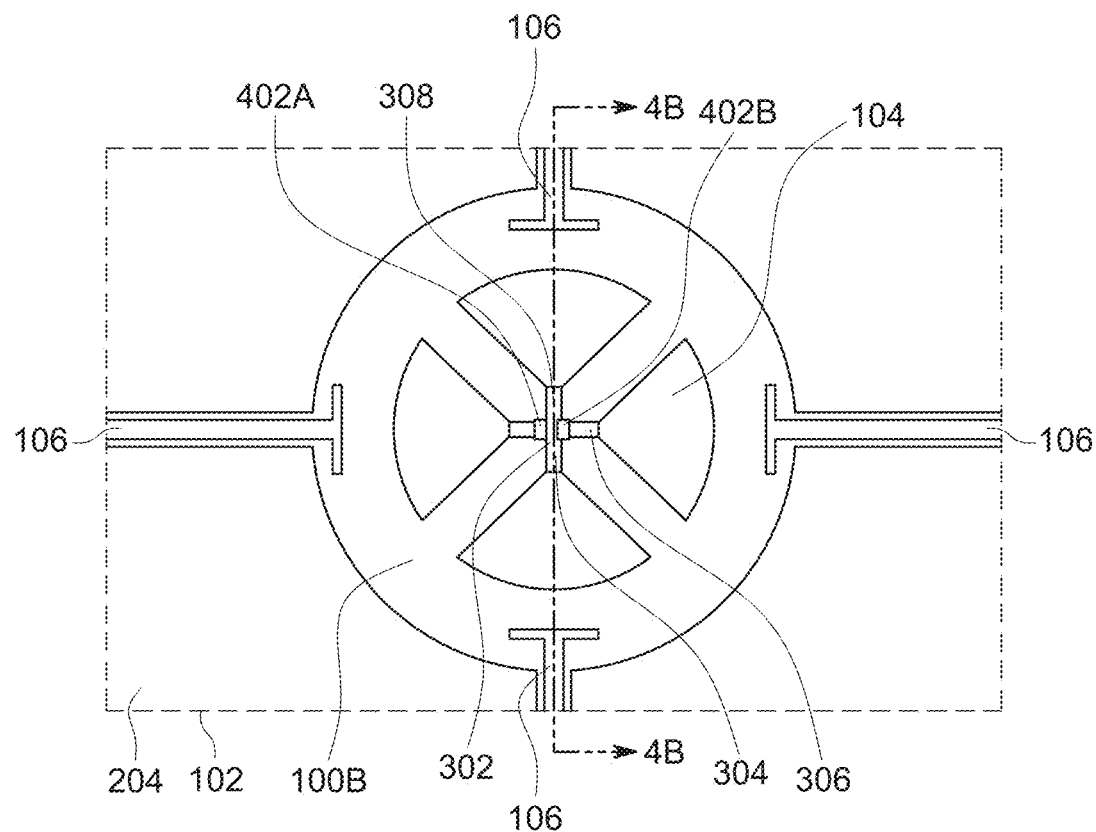
FIG. 4A is a schematic top view of the substrate with the superconducting material and sacrificial resist layers deposited thereon and trenches formed in the resist layers, according to an embodiment of the present invention.
Figure 4B:
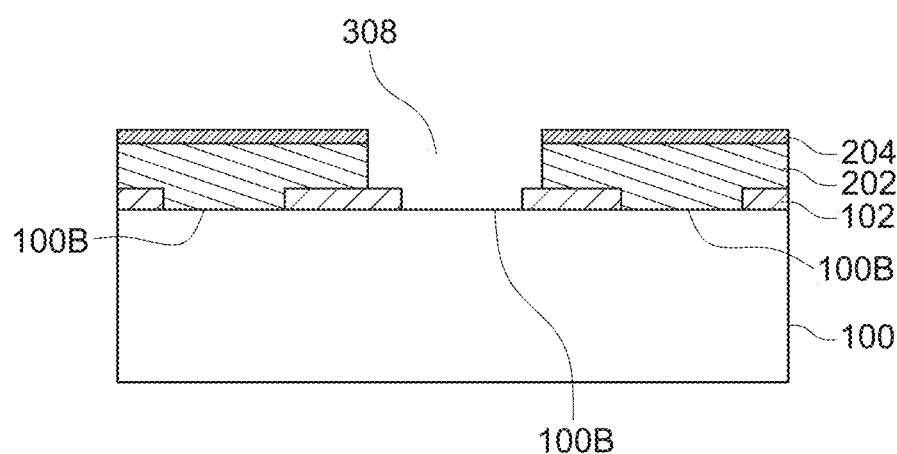
FIG. 4B is a schematic cross-section view of the substrate, along dotted line 4B-4B shown in FIG. 4A, with the superconducting material and sacrificial resist layer deposited thereon and trenches formed in the resist layers, according to an embodiment of the present invention.

FIG. 3A is a schematic top view of the substrate with the superconducting material and sacrificial resist layers deposited thereon and trenches formed in the resist layers, according to an embodiment of the present invention. FIG. 3B is a schematic cross-section view of the substrate, along dotted line 3B-3B shown in FIG. 3A, with the superconducting material and sacrificial resist layer deposited thereon and trenches formed in the resist layers, according to an embodiment of the present invention. FIG. 4A is a schematic top view of the substrate with the superconducting material and sacrificial resist layers deposited thereon and trenches formed in the resist layers, according to an embodiment of the present invention. FIG. 4B is a schematic cross-section view of the substrate, along dotted line 4B-4B shown in FIG. 4A, with the superconducting material and sacrificial resist layer deposited thereon and trenches formed in the resist layers, according to an embodiment of the present invention.

In an embodiment, following the deposition of the sacrificial resist layers 202 and 204, the providing the substructure further includes applying electron beam or optical beam lithography to expose a first portion 302 of the superposed first and second resist layers 202 and 204, and to expose a second portion 304 of the superposed first and second resist layers 202 and 204, as shown in FIGS. 3A and 4A.

In an embodiment, following the application of electron beam or optical beam lithography, the providing the substructure further includes removing the exposed first portion 302 of the superposed first and second resist layers 202 and 204 to form the first trench 306 (shown in FIG. 3B), and removing the exposed second portion 304 of the superposed first and second resist layers 202 and 204 to form the second trench 308 (shown in FIG. 4B). As shown in FIG. 3B, the first resist layer 202 is removed from the exposed first portion 302 to define the first trench 306. As shown in FIG. 4B, the first resist layer 204 is also removed from the exposed second portion 304 to define the second trench 308. In an embodiment, the first trench 306 and the second trench 308 are substantially perpendicular to each other. The first trench 306 is substantially perpendicular to and intersects the second trench 308.

In addition, as shown in FIG. 4B, the second resist layer 204 is also removed from the exposed second portion 304 to define the second trench 308. However, as shown in FIG. 3B, the second resist layer 204 is removed from the exposed first portion 302 to form the first trench 306 except near the intersection of the first and second trenches 306 and 308 to form a bridge structure 402 extending over the first trench 306 with a remaining portion of the second resist layer 204. In an embodiment, the bridge structure 402 is substantially parallel to the second trench 308.

The bridge 402 includes two trips 402A, 402B of second resist layer 204 that both traverse the first trench 306 and that are substantially parallel to and from either side of the second trench 308, as shown in FIGS. 3A, 3B, 4A and 4B. In an embodiment, these two strips 402A and 402B of the bridge 402 are formed because the first resist layer 202 (e.g., MMA) under these two strips 402A is etched faster than the second resist layer 204 (e.g., PMMA).

Figure 5A:
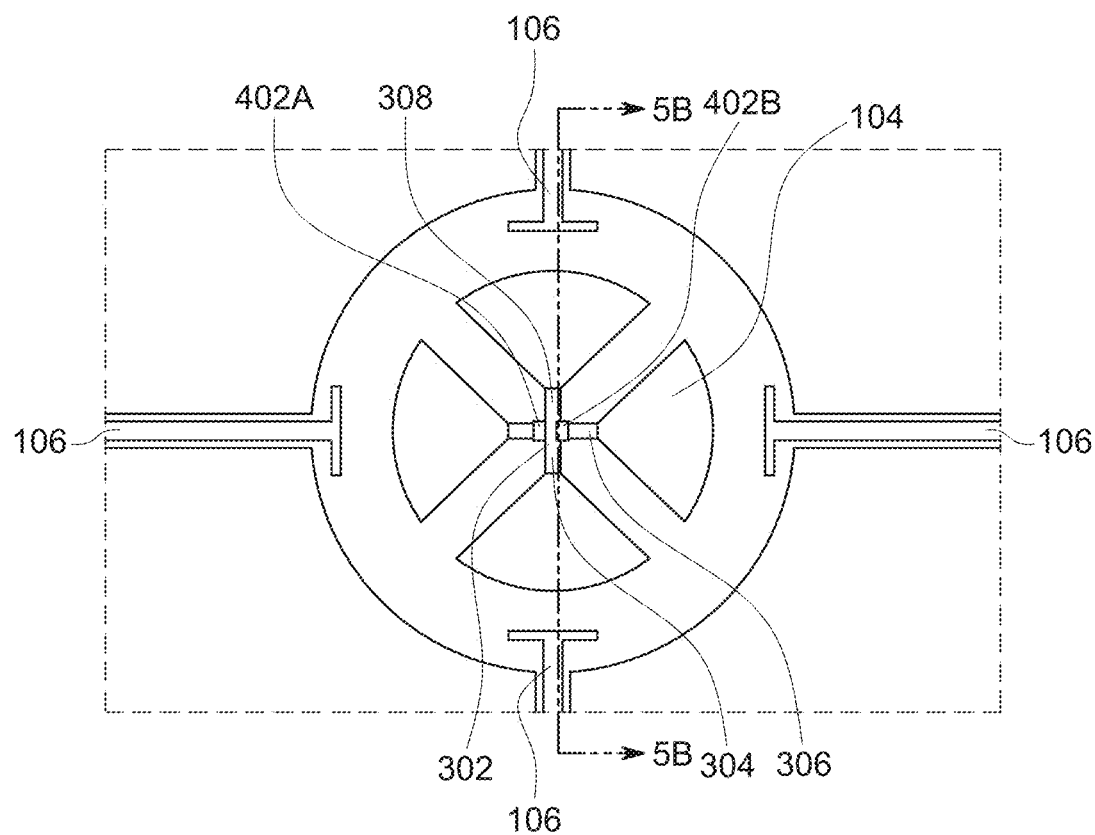
FIG. 5A is a schematic top view of the substrate with the superconducting material and sacrificial resist layers deposited thereon and trenches and bridge formed in the resist layers, according to an embodiment of the present invention.
Figure 5B:
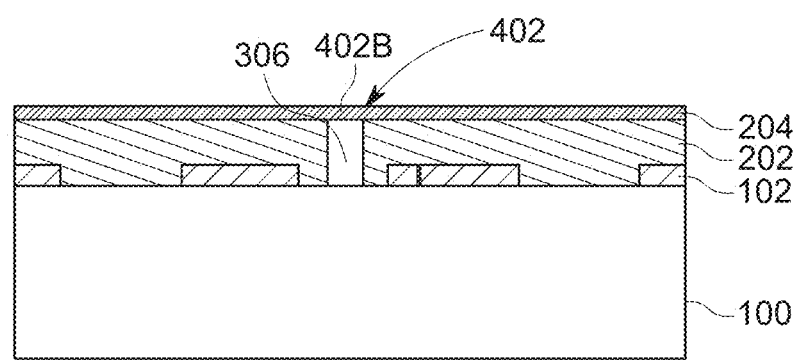
FIG. 5B is a schematic cross-section view of the substrate, along dotted line 5B-5B shown in FIG. 5A, with the superconducting material and sacrificial resist layer deposited thereon and trenches and bridge formed in the resist layers, according to an embodiment of the present invention.

FIG. 5A is a schematic top view of the substrate with the superconducting material and sacrificial resist layers deposited thereon and trenches and bridge formed in the resist layers, according to an embodiment of the present invention. FIG. 5B is a schematic cross-section view of the substrate, along dotted line 5B-5B shown in FIG. 5A, with the superconducting material and sacrificial resist layer deposited thereon and trenches and bridge formed in the resist layers, according to an embodiment of the present invention. As shown in FIG. 5B, for example, the strip 402B of the bridge structure 402 formed in the second resist layer 204 extends over the first trench 306.

Figure 6A:
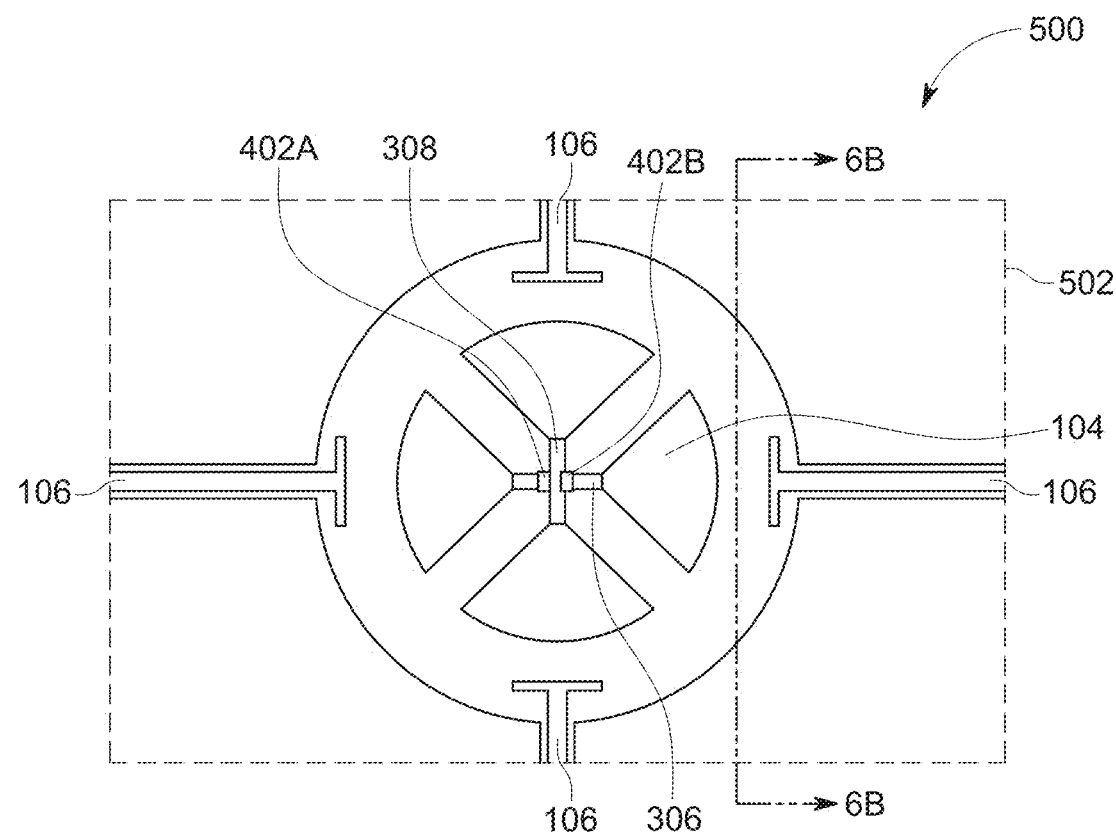
FIG. 6A is a schematic top view of the substrate with the superconducting material and sacrificial resist layers deposited thereon and trenches and bridge formed in the resist layers, according to an embodiment of the present invention.
Figure 6B:
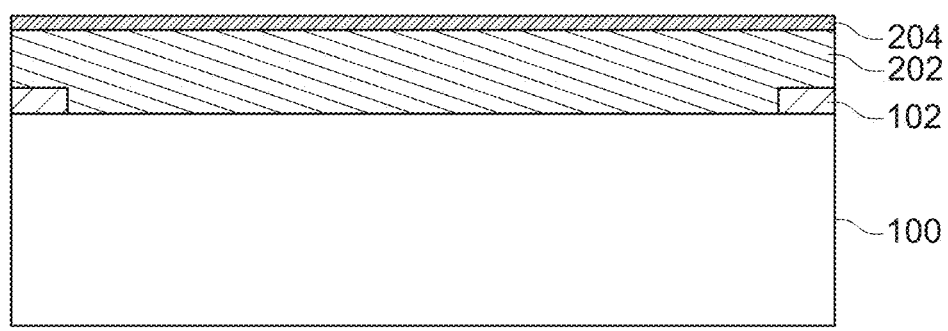
FIG. 6B is a schematic cross-section view of the substrate, along dotted line 6B-6B shown in FIG. 6A, with the superconducting material and sacrificial resist layer deposited thereon and trenches and bridge formed in the resist layers, according to an embodiment of the present invention.

FIG. 6A is a schematic top view of the substrate with the superconducting material and sacrificial resist layers deposited thereon and trenches and bridge formed in the resist layers, according to an embodiment of the present invention. FIG. 6B is a schematic cross-section view of the substrate, along dotted line 6B-6B shown in FIG. 6A, with the superconducting material and sacrificial resist layer deposited thereon and trenches and bridge formed in the resist layers, according to an embodiment of the present invention. As shown in FIG. 6B, at the cross section along line 6B-6B, both the first resist layer 202 and the second resist layer 204 are not etched or removed in this area of the substructure or substrate 100. Therefore, the bridge structure 402 (including the strips 402A and 402B) is only formed near and parallel to the second trench 308 and the bridge structure traverses the first trench 306.

As a result, the provided substructure 500, shown from the top in FIGS. 3A, 4A, 5A and 6A and shown at various cross-sections in FIGS. 3B, 4B, 5B and 6B, includes the substrate 100, the superconducting material 102, the resist layers 202 and 204, the trenches 306 and 308, and the bridge structure 402. As shown for example in FIG. 6A, the substructure 500 has a surface 502 with first and second trenches 306 and 308 defined therein. The first trench 306 is substantially perpendicular to and intersects the second trench 308. The substructure 500 has the bridge structure 402 that extends over the first trench 306 adjacent the intersection of the first and second trenches 306 and 308.

Figure 7A:
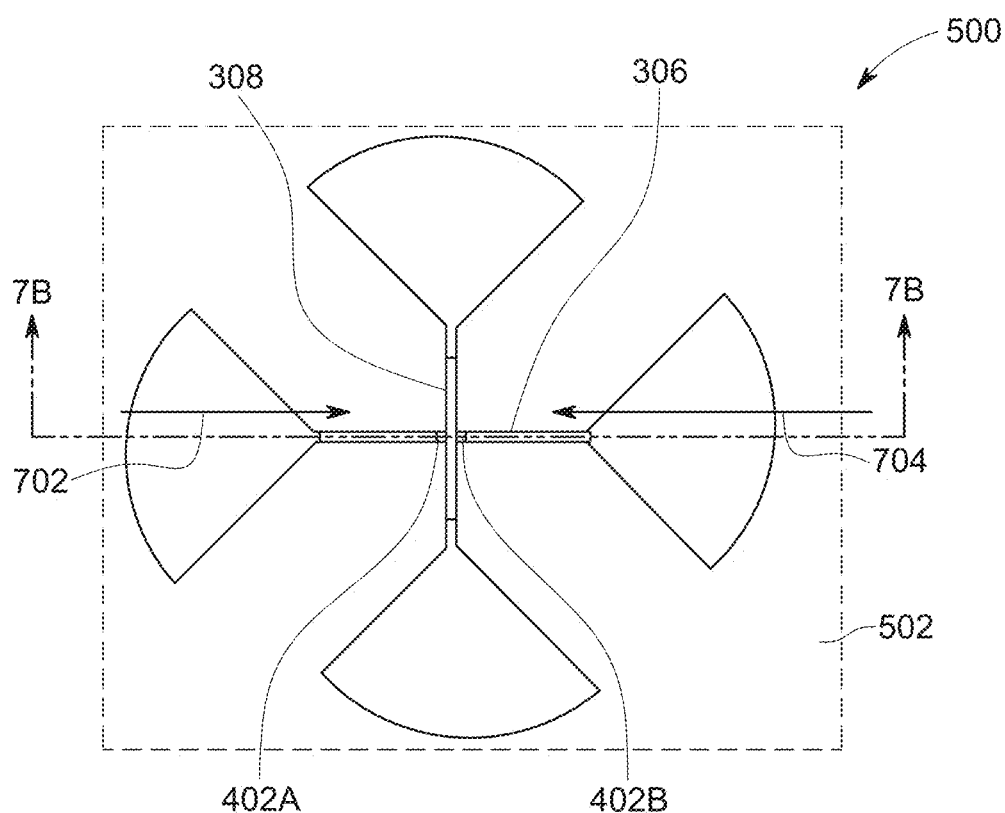
FIG. 7A is a schematic top view of the substrate with the superconducting material and sacrificial resist layers deposited thereon and trenches and bridge formed in the resist layers, according to an embodiment of the present invention.
Figure 7B:
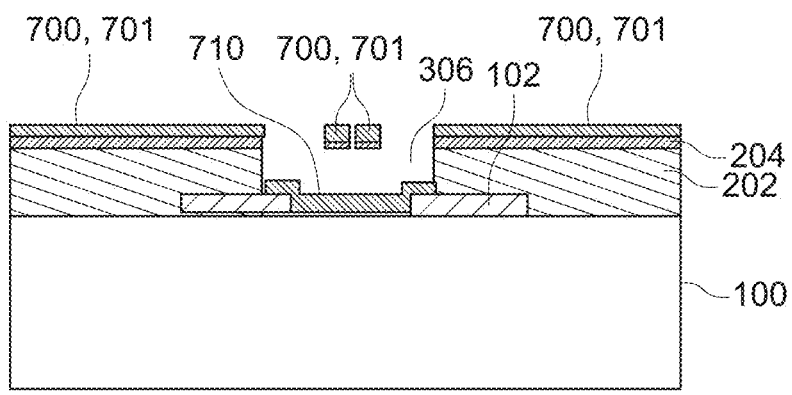
FIG. 7B is a schematic cross-section view of the substrate, along dotted line 7B-7B shown in FIG. 7A, with the superconducting material and sacrificial resist layer deposited thereon and trenches and bridge formed in the resist layers and superconducting material evaporated along the first trench, according to an embodiment of the present invention.

FIG. 7A is a schematic top view of the substrate with the superconducting material and sacrificial resist layers deposited thereon and trenches and bridge formed in the resist layers, according to an embodiment of the present invention. FIG. 7B is a schematic cross-section view of the substrate, along dotted line 7B-7B shown in FIG. 7A, with the superconducting material and sacrificial resist layer deposited thereon and trenches and bridge formed in the resist layers and superconducting material evaporated along the first trench, according to an embodiment of the present invention.

As depicted in FIGS. 7A and 7B, the method of making the Josephson junction for the superconducting qubit further includes evaporating (first evaporation) a superconducting material 700 at a glancing angle along a first direction 702 to deposit the superconducting material 700 in the first trench 306 so as to extend under the bridge structure 402 (under both strip 402A and strip 402B of the bridge structure 402) from the first direction 702. As depicted in FIGS. 7A and 7B, the method of making the Josephson junction for the superconducting qubit further includes evaporating (second evaporation) a superconducting material 701 substantially at the glancing angle in a direction 704 substantially opposite to the first direction 702 to deposit the superconducting material 701 in the first trench 306 so as to extend under the bridge structure 402 (under both strip 402A and strip 402B of the bridge structure 402) from the angle substantially opposite to the first direction 702 so as to provide a first superconducting lead 710.

In an embodiment, the evaporating of the superconducting material 700 at the glancing angle along the first direction 702 to deposit the superconducting material 700 in the first trench 306 includes depositing the superconducting material 700 under the bridge structure 402. In an embodiment, evaporating the superconducting material 701 substantially at the glancing angle in the direction 704 substantially opposite to the first direction 702 to deposit the superconducting material 701 in the first trench 306 includes depositing the superconducting material 701 in zones (not shown) shadowed by the bridge structure 402 and not filled or not completely filled by the superconducting material 700 during the evaporating of the superconducting material 700.

In an embodiment, the glancing angle can be any angle between about 5 degrees and 85 degrees relative to the surface 502 of the substructure 500. In an embodiment, the glancing angle is between 55 degrees and 65 degrees. In a further embodiment, the glancing angle is about 45 degrees. In an embodiment, the glancing angle is selected depending on the type of the material of the resist layers 202 and 204 used, depending on the size of the bridge 402 (i.e., size of strip 402A and size of strip 402B), the size (e.g. width) of the first trench 306, and/or thickness or depth of the resist layers 202 and 204.

Figure 8A:
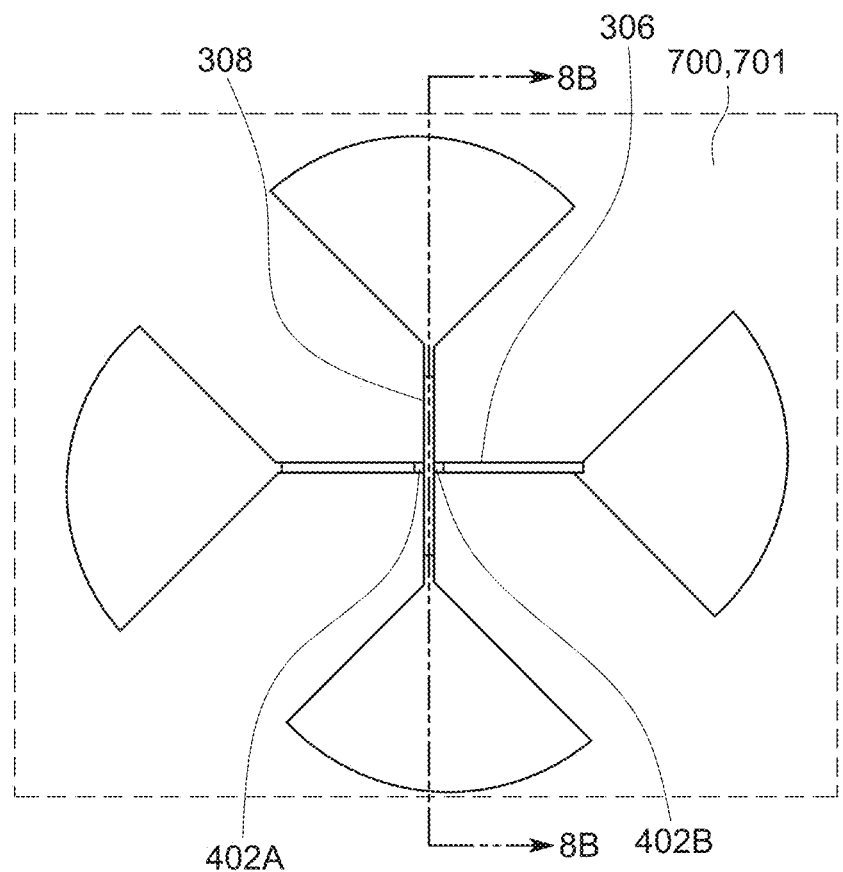
FIG. 8A is a schematic top view of the substrate with the superconducting material and sacrificial resist layers deposited thereon, trenches and bridge formed in the resist layers and superconducting material deposited on the resist layers, according to an embodiment of the present invention.
Figure 8B:
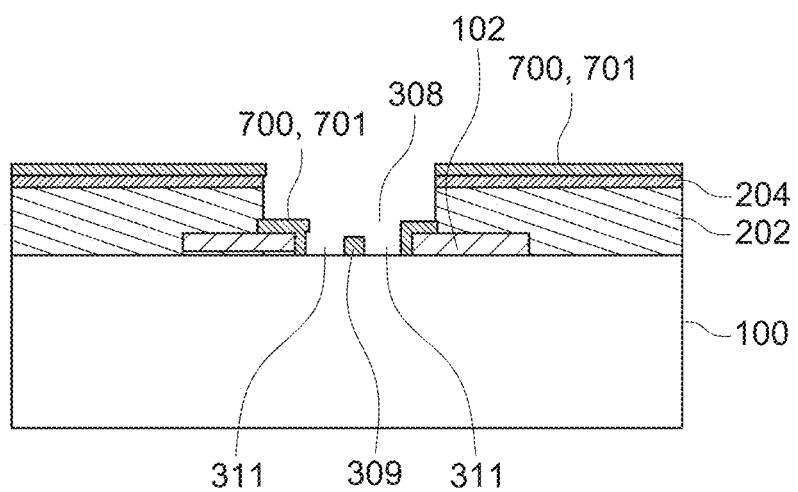
FIG. 8B is a schematic cross-section view of the substrate, along dotted line 8B-8B shown in FIG. 8A, with the superconducting material and sacrificial resist layer deposited thereon and trenches and bridge formed in the resist layers and superconducting material evaporated along the first trench, according to an embodiment of the present invention.

FIG. 8A is a schematic top view of the substrate with the superconducting material and sacrificial resist layers deposited thereon, trenches and bridge formed in the resist layers and superconducting material deposited on the resist layers, according to an embodiment of the present invention. FIG. 8B is a schematic cross-section view of the substrate, along dotted line 8B-8B shown in FIG. 8A, with the superconducting material and sacrificial resist layer deposited thereon and trenches and bridge formed in the resist layers and superconducting material evaporated along the first trench, according to an embodiment of the present invention. As depicted in FIG. 8B which shows the cross-section along the line 8B-8B and along the second trench 308, superconducting materials 700, 701 are deposited on the superconducting material 102 and on the stack of resist layers 202 and 204. However, as illustrated in FIG. 8B, substantially no superconducting materials 700, 701 are deposited in the second trench 308. Indeed, the superconducting material 700, 701 are evaporated at a glancing angle in two opposite directions as shown in FIG. 7A and the bridge structure 402 (including the two strips 402A and 402B) prevent superconducting material 700, 701 from being deposited in the second trench 308. However, FIG. 8B which shows the cross-section along the second trench 308, also shows a portion 309 of superconducting materials 700, 701 that is deposited during the first and second evaporations. The portion 309 of superconducting materials 700 and 701 is deposited due to the spacing between the strips 402A and 402B of the bridge 402 corresponding to the width of the second trench 308. A gap 311 is present on each side of the portion 309 due to the strips 402A and 402B of the bridge 402.

Figure 9A:
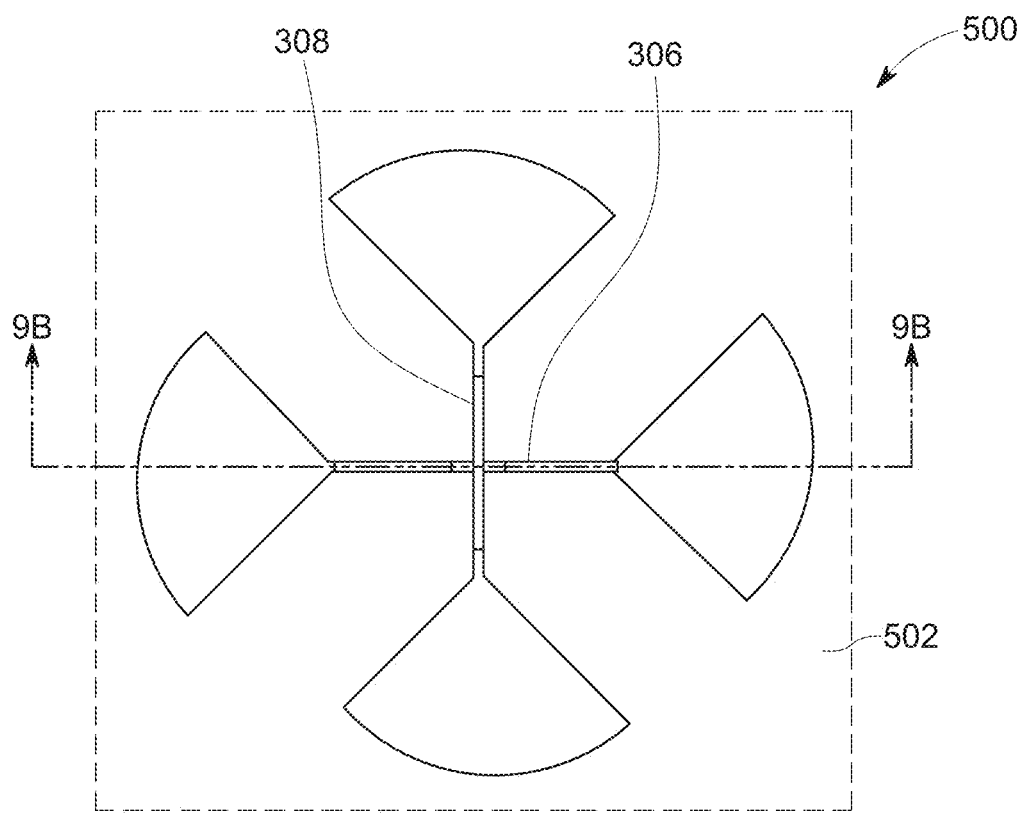
FIG. 9A is a schematic top view of the substrate with the superconducting material and sacrificial resist layers deposited thereon, trenches and bridge formed in the resist layers and superconducting material deposited on the resist layers with a first and second evaporation, according to an embodiment of the present invention.
Figure 9B:
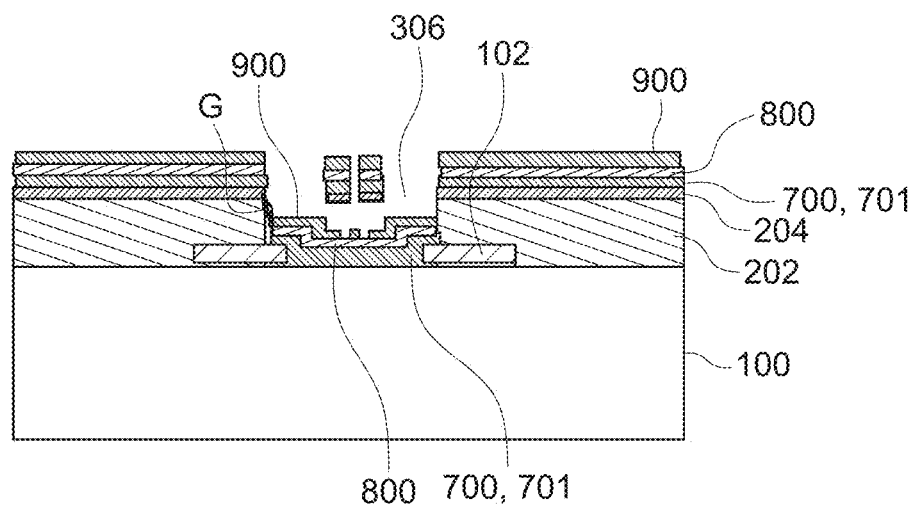
FIG. 9B is a schematic cross-section view of the substrate, along dotted line 9B-9B shown in FIG. 9A, with the superconducting material and sacrificial resist layer deposited thereon and trenches and bridge formed in the resist layers and superconducting material evaporated along the second trench, according to an embodiment of the present invention.

After depositing the superconducting materials 700, 701 by performing the first and second evaporations at the glancing angle, as described above and further shown in FIG. 9A, the method includes oxidizing the superconducting materials 700, 701 to form an oxidized or oxide layer 800 on the superconducting materials 700, 701 at least within the first trench 306, as shown in FIG. 9B.

FIG. 9A is a schematic top view of the substrate with the superconducting material and sacrificial resist layers deposited thereon, trenches and bridge formed in the resist layers and superconducting material deposited on the resist layers with a first and second evaporation, according to an embodiment of the present invention. FIG. 9B is a schematic cross-section view of the substrate, along dotted line 9B-9B shown in FIG. 9A, with the superconducting material and sacrificial resist layer deposited thereon and trenches and bridge formed in the resist layers and superconducting material evaporated along the second trench, according to an embodiment of the present invention.

As shown in FIG. 9B, during the oxidizing of the superconducting materials 700, 701 to form the oxide layer 800 on the superconducting materials 700, 701, a layer of an oxide of the superconducting material 800 is formed on the superconducting materials 700, 701 at least within the first trench 306, as shown in FIG. 9B. The oxide layer 800 is formed everywhere the superconducting materials 700, 701 are present including the first trench 306, as shown in FIG. 9B. The oxide layer 800 is also formed on top of the portion 309 of superconducting materials 700, 701 located at the middle of the second trench 308.

As further illustrated in FIG. 9B, following the formation of the oxide layer 800, the method includes evaporating a superconducting material 900 at an angle substantially perpendicular to the surface 502 of the substructure 500 to deposit the superconducting material 900 in the second trench 308 within the substructure 500 (third evaporation). The evaporation of the superconducting material 900 is performed without rotating the substructure 500. As shown in FIG. 9B, the layer of superconducting material 900 is also deposited in the first trench 306 thus sandwiching the oxide layer 800 between the superconducting materials 700, 701 and the superconducting layer 900. Therefore, at the center of the first trench 306 there is provided a stack of superconducting materials layer 700, 701, oxide layer 800, and superconducting material layer 900.

As shown in FIG. 9B, a thickness of the first resist layer 202 is selected so that a gap "G" is provided between the superconducting material 900 (deposited during the third evaporation) and the second resist layer forming the bridge structure 402.

Figure 10A:
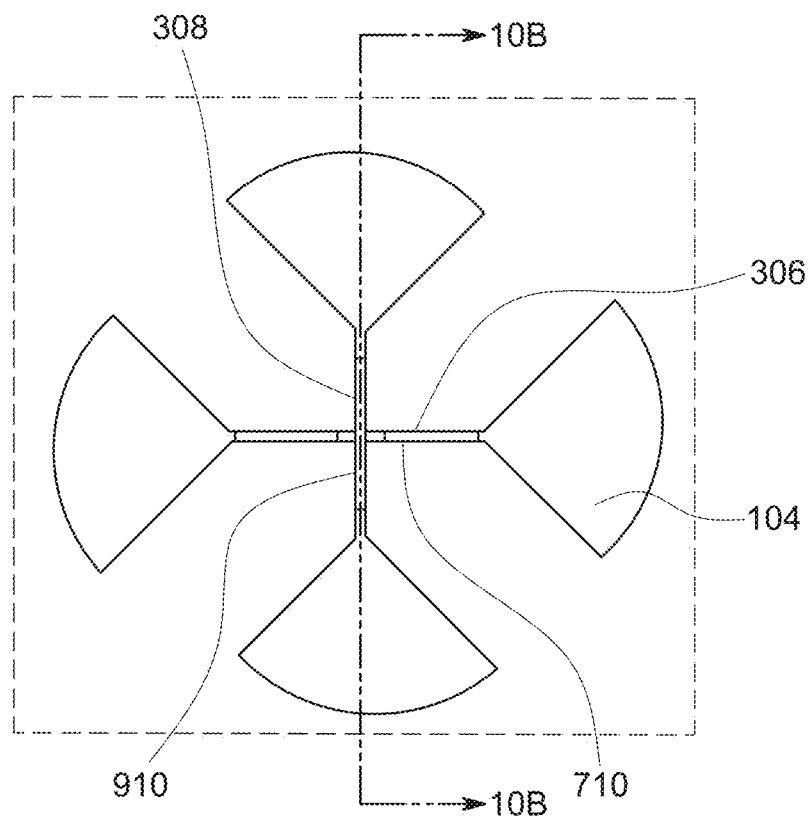
FIG. 10A is a schematic top view of the substrate with the superconducting material and sacrificial resist layers deposited thereon, and superconducting material deposited in the first trench and the second trench, according to an embodiment of the present invention.
Figure 10B:
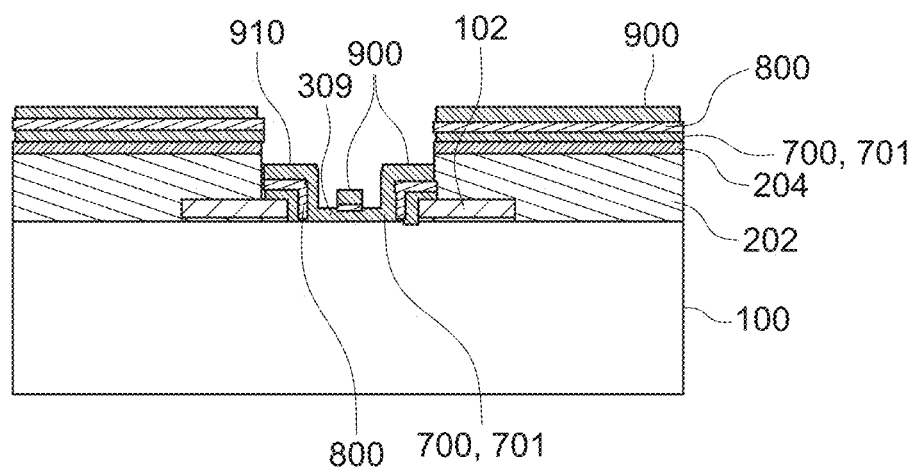
FIG. 10B is a schematic cross-section view of the substrate, along dotted line 10B-10B shown in FIG. 10A, with the superconducting material and sacrificial resist layer deposited thereon and trenches and bridge formed in the resist layers and superconducting material evaporated along the second trench, according to an embodiment of the present invention.

FIG. 10A is a schematic top view of the substrate with the superconducting material and sacrificial resist layers deposited thereon, and superconducting material deposited in the first trench and the second trench, according to an embodiment of the present invention. FIG. 10B is a schematic cross-section view of the substrate, along dotted line 10B-10B shown in FIG. 10A, with the superconducting material and sacrificial resist layer deposited thereon and trenches and bridge formed in the resist layers and superconducting material evaporated along the second trench, according to an embodiment of the present invention.

As shown in FIG. 10B, evaporating the superconducting material 900 at an angle substantially perpendicular to the surface 502 of the substructure 500 (third evaporation) deposits the superconducting material 900 in the second trench 308 within the substructure 500. The evaporating of the superconducting material 900 forms a second superconducting lead 910, as shown in FIG. 10B. During the third evaporation, superconducting material is also deposited on the portion 309 of superconducting materials 700, 701 having an oxide layer thereon. In addition, as shown in FIG. 10B, superconducting material 900 also fills the gap 311 on each side of the portion 309 created during the first and second evaporation (shown in FIG. 8B). Therefore, at the center of the second trench 308 there is provided a stack of superconductors layer 700, 701, oxide layer 800, and superconductor material layer 900.

The method of making the Josephson junction for the superconducting qubit further includes lifting off regions of the deposited superconducting materials 700, 701 and 900 and the oxide layer 800 to leave a vertical Josephson junction at the intersection of the first and second trenches 306 and 308 electrically connected at a first end thereof through the first superconducting lead 710 and at a second end thereof through the second superconducting lead 910.

In an embodiment, superconducting materials 102, 700, 701 and 900 can be a same superconducting material or different superconducting materials. For example, superconducting material 102 can be Niobium and superconducting materials 700, 701 and 900 can be Aluminum or other superconducting material. In addition, the superconducting materials 700, 701 and 900 can also be different superconducting materials. In addition, superconducting material 102 can the same superconducting material as the superconducting material 700, superconducting material 701 or superconducting material 900.

Figure 11A:
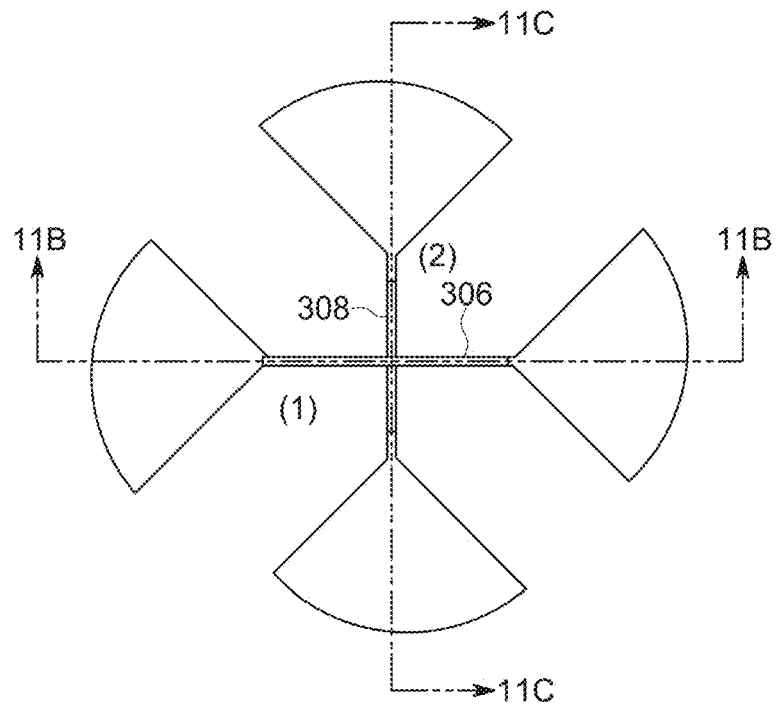
FIG. 11A is a schematic top view of a qubit device formed according to the above described methods, according to an embodiment of the present invention.

FIG. 11A is a schematic top view of a qubit device formed according to the above described methods, according to an embodiment of the present invention. The qubit device includes the plurality of sectors 104 formed by the superconducting material 102 and the first trench 306 filled with, among others, superconducting material 700, 101 and 900 which form the first lead 710 and second trench 308 filled with, among others, superconducting material 700, 101 and 900 which form the second lead 910.

Figure 11B:
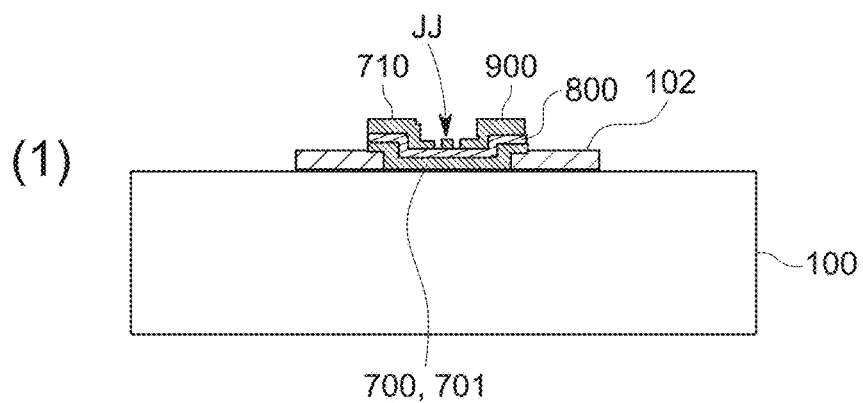
FIG. 11B is a schematic cross-section view of the formed qubit device along dotted line 11B-11B shown in FIG. 11A, according to an embodiment of the present invention.
Figure 11C:
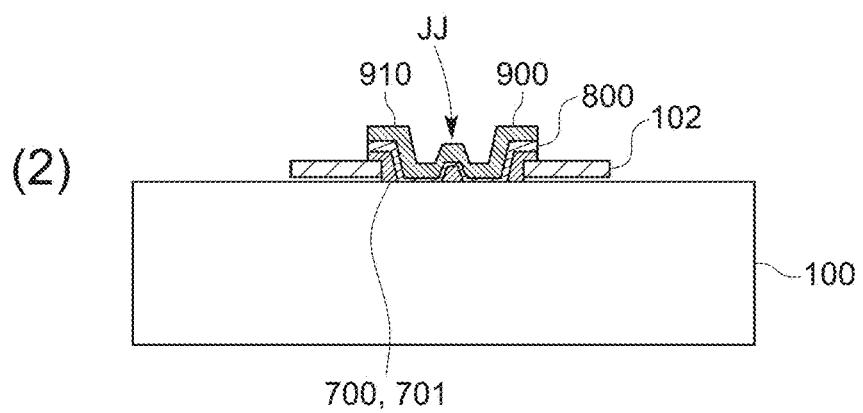
FIG. 11C is a schematic cross-section view of the formed qubit device along dotted line 11C-11C shown in FIG. 11A, according to an embodiment of the present invention

FIG. 11B is a schematic cross-section view of the formed qubit device along dotted line 11B-11B shown in FIG. 11A, according to an embodiment of the present invention. FIG. 11C is a schematic cross-section view of the formed qubit device along dotted line 11C-11C shown in FIG. 11A, according to an embodiment of the present invention. As shown in FIGS. 11B and 11C, a Josephson junction "JJ" is formed vertically by the stack of the superconducting materials layer 700, 701, oxide layer 800, and superconducting material layer 900. The Josephson junction JJ is connected to the superconducting material 102 of two sectors 104 via first lead line 710 along the first trench 306 and connected to superconducting material 102 of two other sectors 104 via second lead line 910.

Figure 12A:
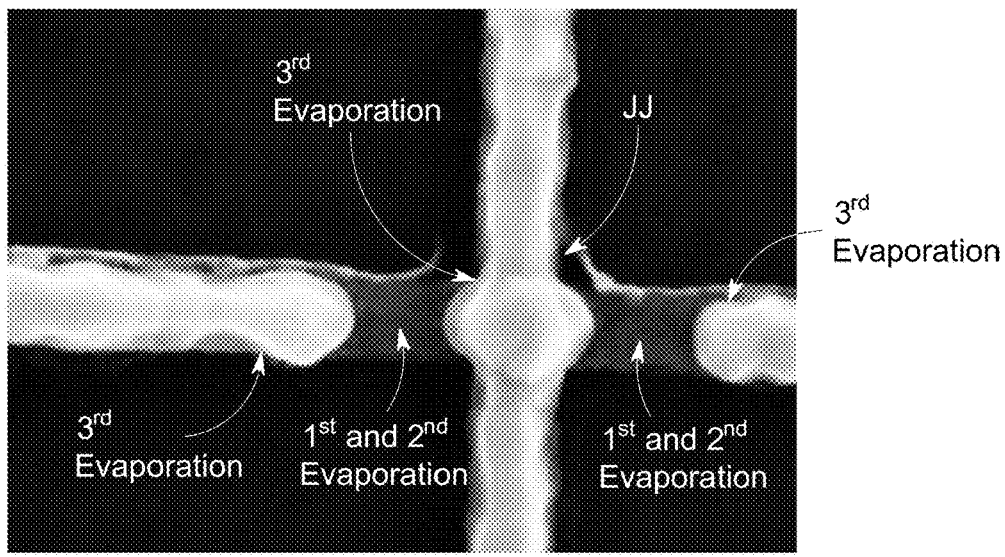
FIG. 12A is a zoomed-in scanning microscope (SEM) image showing the qubit device formed using the above described methods, according to an embodiment of the present invention.

FIG. 12A is a zoomed-in scanning microscope (SEM) image showing the qubit device formed using the above described methods, according to an embodiment of the present invention. The first and second evaporations used for depositing the superconducting materials 700, 701 and the third evaporation used for depositing the superconducting material 900 are indicated by arrows in the SEM image. The central feature in the image and referenced by the characters "JJ" corresponds to the Josephson junction. The Josephson junction includes a stack of the superconducting materials layer 700, 701, the oxide layer 800 and the superconducting material layer 900.

Figure 12B:
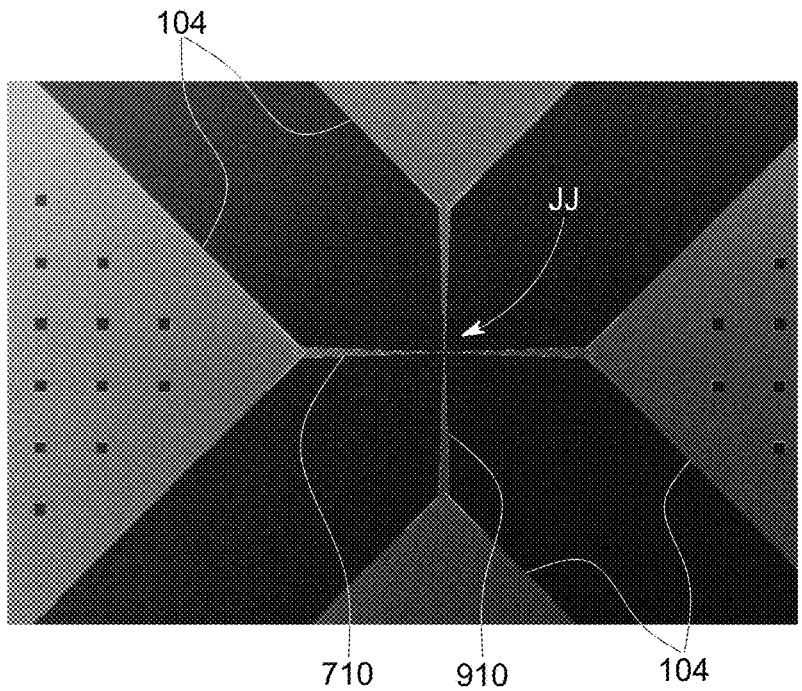
FIG. 12B is a zoomed-out scanning microscope (SEM) image showing the qubit device formed using the above described methods, according to an embodiment of the present invention.

FIG. 12B is a zoomed-out scanning microscope (SEM) image showing the qubit device formed using the above described methods, according to an embodiment of the present invention. As shown in FIG. 12B, the Josephson junction (JJ) is connected the first lead line 710 which connects the JJ to the first pair of sectors, quadrants or pads 104. The Josephson junction is also connected to the second lead line 910 which connects the JJ to second pair of sectors, quadrants or pads 104.

In the above paragraphs, it is described according to some embodiments of the present invention the sectors, quadrants or pads 104 are made separately by depositing superconducting material 102 on the substrate 100. However, according to another embodiment of the present invention, the sectors, quadrants or pads 104 and associated buses 106 can be made at the same time when depositing the superconducting materials 700 and 701, i.e., during the first and second evaporations. In this case, the method includes evaporating the superconducting material 700 at the glancing angle along the first direction to deposit the superconducting material 700 on the surface 100A of the substrate 100; and evaporating the superconducting material 701 substantially at the glancing angle substantially opposite to the first direction to deposit the superconducting material 701 on the surface 100A of the substrate 100 to form four sectors 104 and associated buses 106. The four sectors or pads 104 are separated apart by the uncovered portion 102B of the surface 102A of the substrate 100.

As it can be appreciated from the above paragraphs, there is also provided a superconducting qubit device, the superconducting qubit being made by the above methods. The above described methods of forming a Josephson junction (JJ) for a superconducting qubit device allows to reduce the number of steps for the manufacture of the qubit device, for example by eliminating the rotation of the substrate or substructure and instead performing a third evaporation vertically relative to the surface of the substrate or substructure to deposit the superconducting layer 900. In addition, during the Josephson junction fabrication the leads are also made simultaneous with the Josephson junction which allows to create better contacts which results in low inductance lines. Furthermore, the methods according to some embodiments of the present invention allow to substantially eliminate unwanted shadows for better connection thus better transmission of microwave energy to and from the Josephson junction.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of making a Josephson junction for a superconducting qubit, comprising:
   providing a substructure having a surface with first and second trenches defined therein, said first trench being substantially perpendicular to and intersecting said second trench, said substructure having a bridge structure extending over said first trench adjacent said intersection of said first and second trenches;
   evaporating a first superconducting material at a glancing angle along a first direction to deposit said first superconducting material in said first trench so as to extend under said bridge structure from said first direction;
   evaporating a second superconducting material substantially at the glancing angle substantially opposite to the first direction to deposit the second superconducting material in the first trench so as to extend under said bridge structure from said glancing angle substantially opposite to said first direction and to provide a first superconducting lead;
   oxidizing the first and second superconducting materials to form an oxidized layer on the first and second superconducting materials at least within said first trench;
   evaporating a third superconducting material at an angle substantially perpendicular to said surface of the substructure to deposit the third superconducting material in said second trench within the substructure without rotating the substructure to form a second superconducting lead; and
   lifting off regions of said deposited first, second and third superconducting materials and said oxide layer to leave a vertical Josephson Junction at said intersection of said first and second trenches electrically connected at a first end thereof through said first superconducting lead and at a second end thereof through said second superconducting lead.

2. The method according to claim 1, wherein the first, second and third superconducting materials are a same superconducting material.

3. The method according to claim 1, wherein providing the substructure comprises:
   providing a substrate;
   depositing a fourth superconducting material on a surface of the substrate;
   removing a portion of the fourth superconducting material from the surface of the substrate to uncover a portion of the surface of the substrate;
   depositing a first resist layer on the fourth superconducting material and on the uncovered portion of the surface of the substrate; and
   depositing a second resist layer on the first resist layer to form superposed first and second resist layers.

4. The method according to claim 3, wherein the fourth superconducting material is a same superconducting material as the first, second or third superconducting material.

5. The method according to claim 3, wherein providing the substructure further comprises:
   applying electron beam or optical beam lithography to expose a first portion of the superposed first and second resist layers and to expose a second portion of the superposed first and second resist layers.

6. The method according to claim 3, wherein providing the substructure further comprises:
   removing the exposed first portion of the superposed first and second resist layers to form the first trench; and
   removing the exposed second portion of the superposed first and second resist layers to form the second trench and form the bridge structure extending over said first trench with a remaining portion of the second resist layer, the bridge structure being substantially parallel to the second trench.

7. The method according to claim 6, wherein evaporating the first superconducting material at the glancing angle along the first direction to deposit the first superconducting material in the first trench comprises depositing the first superconducting material under the bridge structure.

8. The method according to claim 7, wherein evaporating the second superconducting material substantially at the glancing angle substantially opposite to the first direction to deposit the second superconducting material in the first trench comprises depositing the second superconducting material in zones shadowed by the bridge structure and not filled by the first superconducting material during the evaporating of the first superconducting material.

9. The method according to claim 3, wherein the substrate is selected from the group consisting of Silicon (Si), Germanium (Ge), and Sapphire.

10. The method according to claim 3, wherein the first, second, third and fourth superconducting materials are selected from the group consisting of Niobium (Nb) and Aluminum (Al).

11. The method according to claim 3, wherein removing the portion of the superconducting material from the surface of the substrate to uncover the portion of the surface of the substrate comprises forming four sectors of the fourth superconducting material and associated buses, the four sectors being separated apart by the uncovered portion of the surface of the substrate.

12. The method according to claim 3, wherein depositing the first resist layer on the superconducting material and on the uncovered portion of the surface of the substrate comprises depositing a layer of monomethyl methacrylate (MMA), and
   wherein depositing the second resist layer on the first resist layer comprises depositing a layer of polymethyl methacrylate (PMMA).

13. The method according to claim 1, wherein the glancing angle is between about 5 degrees and 85 degrees relative to the surface of the substructure.

14. The method according to claim 1, further comprising:
   providing a substrate;
   evaporating the first superconducting material at the glancing angle along the first direction to deposit said first superconducting material on a surface of the substrate;
   evaporating the second superconducting material substantially at the glancing angle substantially opposite to the first direction to deposit the second superconducting material on the surface of the substrate to form four sectors of the first and second superconducting materials and associated buses, the four sectors being separated apart by the uncovered portion of the surface of the substrate.

15. A superconducting qubit, the superconducting qubit being made by:
   providing a substructure having a surface with first and second trenches defined therein, said first trench being substantially perpendicular to and intersecting said second trench, said substructure having a bridge structure extending over said first trench;
   evaporating a first superconducting material at a glancing angle along a first direction to deposit said first superconducting material in said first trench so as to extend under said bridge structure from said first direction;
   evaporating a second superconducting material substantially at the glancing angle substantially opposite to the first direction to deposit the second superconducting material in the first trench so as to extend under said bridge structure from said glancing angle substantially opposite to said first direction and to provide a first superconducting lead;
   oxidizing the first and second superconducting materials to form an oxidized layer on the first and second superconducting materials at least within said first trench;
   evaporating a third superconducting material at an angle substantially perpendicular to said surface of the substructure to deposit the third superconducting material in said second trench within the substructure without rotating the substructure to form a second superconducting lead; and
   lifting off regions of said deposited first, second and third superconducting materials and said oxide layer to leave a vertical Josephson Junction at said intersection of said first and second trenches electrically connected at a first end thereof through said first superconducting lead and at a second end thereof through said second superconducting lead.

16. The superconducting qubit according to claim 15, wherein the first, second and third superconducting materials are a same superconducting material.

17. The superconducting qubit according to claim 15, wherein providing the substructure comprises:
   providing a substrate;
   depositing a fourth superconducting material on a surface of the substrate;
   removing a portion of the fourth superconducting material from the surface of the substrate to uncover a portion of the surface of the substrate;
   depositing a first resist layer on the fourth superconducting material and on the uncovered portion of the surface of the substrate; and
   depositing a second resist layer on the first resist layer to form superposed first and second resist layers.

18. The superconducting qubit according to claim 17, wherein the fourth superconducting material is a same superconducting material as the first, second or third superconducting material.

19. The superconducting qubit according to claim 17, wherein providing the substructure further comprises:
   applying particle beam or optical beam lithography to expose a first portion of the superposed first and second resist layers and to expose a second portion of the superposed first and second resist layers.

20. The superconducting qubit according to claim 17, wherein providing the substructure further comprises:
   removing the exposed first portion of the superposed first and second resist layers to form the first trench; and
   removing the exposed second portion of the superposed first and second resist layers to form the second trench and form the bridge structure extending over said first trench with a remaining portion of the second resist layer, the bridge structure being substantially parallel to the second trench.

21. The superconducting qubit according to claim 20, wherein evaporating the first superconducting material at the glancing angle along the first direction to deposit the first superconducting material in the first trench comprises depositing the first superconducting material under the bridge structure.

22. The superconducting qubit according to claim 21, wherein evaporating the second superconducting material substantially at the glancing angle substantially opposite to the first direction to deposit the second superconducting material in the first trench comprises depositing the second superconducting material in zones shadowed by the bridge structure and not filled by the first superconducting material during the evaporating of the first superconducting material.

23. The superconducting qubit according to claim 17, wherein the substrate is selected from the group consisting of Silicon (Si), Germanium (Ge), and Sapphire.

24. The superconducting qubit according to claim 17, wherein the first, second, third and fourth superconducting materials are selected from the group consisting of Niobium (Nb) and Aluminum (Al).

25. The superconducting qubit according to claim 17, wherein removing the portion of the superconducting material from the surface of the substrate to uncover the portion of the surface of the substrate comprises forming four sectors of the fourth superconducting material and associated buses, the four sectors being separated apart by the uncovered portion of the surface of the substrate.

* * * * *